(12) United States Patent
Ota

(10) Patent No.: US 8,054,356 B2
(45) Date of Patent: Nov. 8, 2011

(54) IMAGE PICKUP APPARATUS HAVING A CHARGE STORAGE SECTION AND CHARGE SWEEPING SECTION

(75) Inventor: Motoari Ota, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 651 days.

(21) Appl. No.: 12/028,098

(22) Filed: Feb. 8, 2008

(65) Prior Publication Data
US 2008/0211954 A1    Sep. 4, 2008

(30) Foreign Application Priority Data

Feb. 14, 2007   (JP) ................. 2007-033514
Jun. 29, 2007   (JP) ................. 2007-172154

(51) Int. Cl.
*H04N 3/14* (2006.01)
*H04N 5/235* (2006.01)

(52) U.S. Cl. ........................ 348/296; 348/362

(58) Field of Classification Search .................. 348/311, 348/281, 307
See application file for complete search history.

(56) References Cited

U.S. PATENT DOCUMENTS

| 5,532,743 | A | * | 7/1996 | Komobuchi | 348/297 |
| 5,536,956 | A | * | 7/1996 | Kawamoto et al. | 257/239 |
| 5,640,028 | A | * | 6/1997 | Kawamoto et al. | 257/239 |
| 6,784,931 | B1 | * | 8/2004 | Kudo | 348/296 |
| 7,667,754 | B2 | * | 2/2010 | Koyama | 348/308 |
| 2006/0267054 | A1 | * | 11/2006 | Martin et al. | 257/291 |
| 2007/0131974 | A1 | * | 6/2007 | Tanaka | 257/215 |
| 2007/0194400 | A1 | * | 8/2007 | Yokoyama | 257/443 |
| 2008/0036888 | A1 | * | 2/2008 | Sugawa et al. | 348/294 |

FOREIGN PATENT DOCUMENTS

JP   2002-502120 A   1/2002
JP   2002-83946 A    3/2002

* cited by examiner

*Primary Examiner* — Hung Lam
(74) *Attorney, Agent, or Firm* — Sughrue Mion, PLLC (57) ABSTRACT

A lower electrode, a photoelectric conversion layer, and an upper electrode are stacked in order above a semiconductor substrate, and a charge storage section that stores charge generated in the photoelectric conversion layer is connected to the lower electrode. The charge stored in the charge storage section is swept away by a charge sweeping away section for a given time from the endpoint of exposure. The given time is a time taken until the residual image charge existing in the photoelectric conversion layer at the exposure end point time is sufficiently discharged to the outside of the photoelectric conversion layer in a state in which the same bias as that at the exposure start time point is applied to the photoelectric conversion layer.

6 Claims, 6 Drawing Sheets

IMAGE PICKUP APPARATUS HAVING A CHARGE STORAGE SECTION AND CHARGE SWEEPING SECTION

BACKGROUND OF THE INVENTION

1. Field of the Invention

This invention relates to an image pickup apparatus having an image pickup device having a photoelectric conversion element stacked above a semiconductor substrate and a charge storage section formed in the semiconductor substrate for storing a charge generated in the photoelectric conversion element for outputting a signal responsive to the charge stored in the charge storage section to the outside.

2. Description of the Related Art

In a single-plate color solid-state image pickup device represented by an image sensor of CCD type or CMOS type, three or four types of color filters are placed on a light reception section array for executing photoelectric conversion as a tessellated pattern. Accordingly, a color signal corresponding to the color filter is output from each light reception section and the color signals are processed, whereby a color image is generated.

However, with the color solid-state image pickup device with the color filters arranged as a tessellated pattern, if the color filters are primary color filters, about two thirds of incidence light are absorbed in the color filters and thus the light use efficiency is poor and the sensitivity is low; this is a problem. Since a color signal only of one color can be obtained in each light reception section, the resolution is also poor and particularly a false color is conspicuous; this is also a problem.

Then, overcome the problems, a stacked solid-state image pickup device of a structure wherein three photoelectric conversion layers are stacked on a semiconductor substrate has been researched and developed (for example, JP-T-2002-502120 and JP-A-2002-83946). This stacked solid-state image pickup device has a light reception section structure wherein photoelectric conversion layers for generating charges (electrons, holes) for light of B, G, and R are stacked in order from a light incidence face and moreover is provided with a charge storage section for storing a signal charge generated in each photoelectric conversion layer and a signal read circuit capable of reading a signal responsive to the charge stored in the charge storage section for each light reception section. Each photoelectric conversion layer is sandwiched between paired electrodes and one of the paired electrodes and the charge storage section are electrically connected, whereby the charge generated in the photoelectric conversion layer and moved to the one electrode is stored in the charge storage section.

With the described image pickup device, incidence light is almost converted into electricity for read and the use efficiency of visible light is near to 100% and moreover color signals of three colors of R, G, and B are provided in the light reception sections, so that a good image with high sensitivity and high resolution (false color is inconspicuous) can be generated.

The signal read circuit of the stacked image pickup device can be a CCD circuit for reading a charge stored in a charge storage section to a charge transfer section for transfer and converting the post-transferred charge into a signal voltage with an FD amplifier, etc., for output, a MOS circuit for converting a charge stored in a charge storage section into a signal voltage with a MOS transistor, or the like. To adopt the CCD circuit or the MOS circuit, after the signal read, it is necessary to sweep away the charge remaining in the charge storage section (transfer remaining charge if the CCD circuit is adopted) to a substrate, etc., and as an art concerning sweeping away of the charge, the art used with the single-plate image pickup device can be adopted.

For example, for the MOS circuit, a structure can be adopted wherein after an exposure time period expires, a signal responsive to the charge stored in the charge storage section in the exposure time period is output from the MOS circuit and then a reset pulse is supplied to a gate of a reset transistor for discharging an unnecessary charge to a reset drain.

Figure 8:
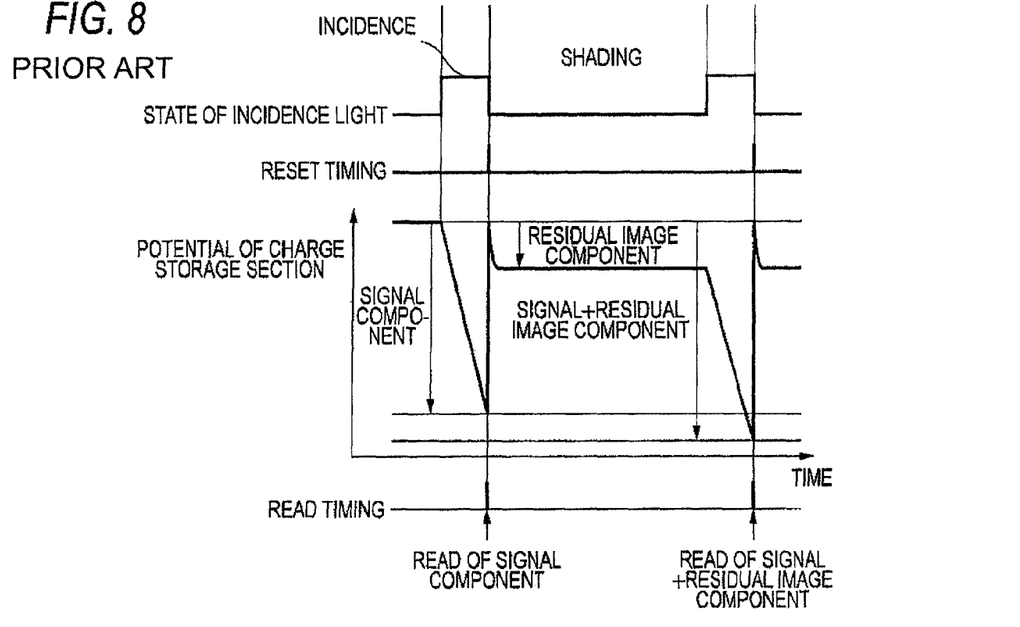
FIG. 8 is a timing chart to describe the reset operation of a stacked image pickup device.

FIG. 8 is a timing chart to describe the reset operation of the single-plate image pickup device. In FIG. 8, the case where the exposure time period and non-exposure time period of the image pickup device are controlled with a mechanical shutter is taken as an example.

When incidence light is incident on the image pickup device and the charge generated in the photoelectric conversion layer is stored in the charge storage section, the potential of the charge storage section rises as shown in the figure. After exposure terminates, a signal responsive to the charge stored in the charge storage section is output from the MOS circuit and the charge in the charge storage section is reset. When no light is incident after the reset operation, if a carrier generated in the photoelectric conversion layer is stored in the charge storage section in an instant, the potential of the charge storage section should not rise after the reset operation. However, a considerable time may be required until the carrier generated in the photoelectric conversion layer arrives at an electrode connected to the charge storage section and thus a carrier not moved to the charge storage section although it was generated in the photoelectric conversion layer during the exposure time period is stored in the charge storage section after reset as a residual image component. The residual image component mixes with a carrier stored in the charge storage section in the next exposure time period, so that the image quality is degraded. If the residual image component exists in the charge storage section, the potential of the electrode connected to the charge storage section rises and thus the bias voltage applied to the photoelectric conversion layer relatively lowers and a problem of lowering the carrier transport performance and making poor sensitivity can also occur. It is acknowledged that the residual image component in the photoelectric conversion layer decreases exponentially with the passage of time.

Then, it is considered that it is effective to prevent image quality degradation and sensitivity lowering by supplying a reset pulse once more when the residual image component in the photoelectric conversion layer sufficiently decreases. For example, as shown in FIG. 9, after a signal is read, when the residual image component in the photoelectric conversion layer sufficiently decreases, the reset operation may be performed once more and the next exposure may be started in a state in which almost no residual image component exists.

Figure 9:
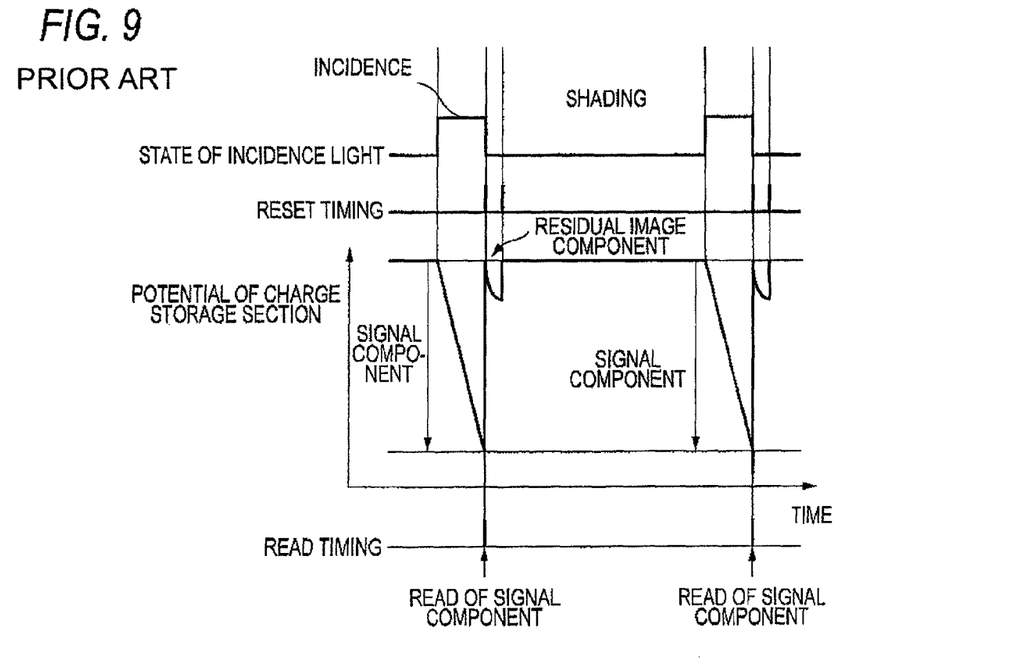
FIG. 9 is a timing chart to describe the operation when resetting of the stacked image pickup device is performed more than once.

However, in so doing, the potential of the charge storage section fluctuates between the reset timings shown in FIG. 9 and thus meanwhile the force pulling out the residual image component in the photoelectric conversion layer to the electrode weakens. Consequently, the time until the residual image component in the photoelectric conversion layer sufficiently decreases is prolonged and the exposure time is shortened.

SUMMARY OF THE INVENTION

It is therefore an object of the invention to provide an image pickup apparatus capable of preventing image quality degradation and sensitivity lowering caused by a charge stored in a charge storage section in any other time period than an exposure time period and extending the exposure time period.

According to the invention, there is provided an image pickup apparatus comprising an image pickup device, the image pickup device comprising: a semiconductor substrate; a photoelectric conversion element stacked above the semiconductor substrate; and a charge storage section in the semiconductor substrate, the charge storage section storing a charge generated in the photoelectric conversion element, to outputs a signal responsive to the charge stored in the charge storage section to an outside of the image pickup device, wherein the photoelectric conversion element comprises: a lower electrode above the semiconductor substrate; a photoelectric conversion layer on the lower electrode; and an upper electrode on the photoelectric conversion layer, wherein the charge storage section is electrically connected to the lower electrode or the upper electrode, wherein the image pickup apparatus further comprises: a charge sweeping away section that sweeps away the charge stored in the charge storage section; and an electrode potential fixing section that keeps a potential of the lower electrode or the upper electrode constant at least for a continuous given time period in a time period from end of an exposure time period of the image pickup device to start of a subsequent exposure time period, wherein the given time period is a time longer than the minimum necessary time for the charge sweeping away section to sweep away the maximum amount of the charge in a state in which the maximum amount of the charge that can be stored in the charge storage section is stored in the charge storage section.

According to the invention, there is provided the image pickup apparatus, further comprising a shading section that shades the image pickup device between the exposure time period and the subsequent exposure time period, wherein the given time period is started at the end point of the exposure time period and is equal to an attenuation time constant of residual image charge in the photoelectric conversion layer when the residual image charge existing in the photoelectric conversion layer at the end point of the exposure time period is discharged to an outside of the photoelectric conversion layer in a state in which the same bias voltage as that at the start point of the exposure time period is applied to the photoelectric conversion layer.

According to the invention, there is provided the image pickup apparatus, wherein the charge sweeping away section is a reset transistor, and wherein the electrode potential fixing section keeps the potential constant by applying a reset voltage to a gate electrode of the reset transistor for the given time period.

According to the invention, there is provided the image pickup apparatus, wherein when the image pickup device is represented as an equivalent circuit, the electrode potential fixing section is a differential amplifier, the differential amplifier comprising an inverting input terminal connected to the lower electrode or the upper electrode and a non-inverting input terminal connected to fixed potential with a first capacitor corresponding to the charge storage section connected between the inverting input terminal and an output terminal, and always keeps the potential in the fixed potential during an operation time period of the image pickup device.

According to the invention, there is provided the image pickup apparatus, further comprising a series circuit connected in parallel to the first capacitor between the inverting input terminal and the output terminal, wherein the series circuit comprises a switch connected to the inverting input terminal and a second capacitor connected to the switch, the second capacitor being different from the first capacitor.

According to the invention, there is provided the image pickup apparatus, further comprising a switch control section that performs control so as to turn on the switch for connecting the inverting input terminal and the second capacitor only if charge stored in the first capacitor exceeds a capacitance of the first capacitor as pre-photographing is performed before principal photographing is performed.

DETAILED DESCRIPTION OF THE INVENTION

Referring now to the accompanying drawings, there are shown embodiments of the invention.

First Embodiment

Figure 1:
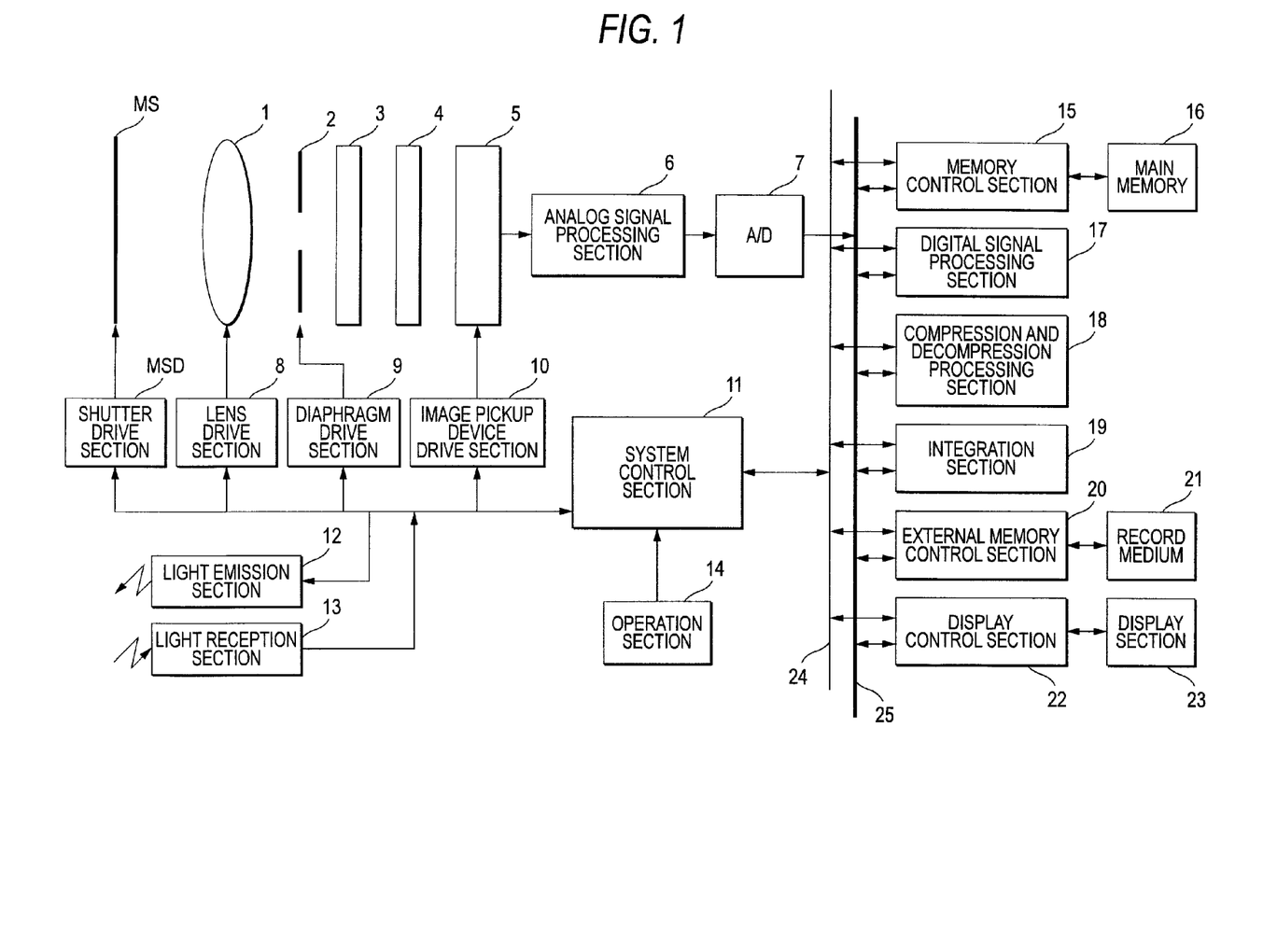
FIG. 1 is a diagram to show the schematic configuration of a digital camera as an example of an image pickup apparatus to describe a first embodiment of the invention.

FIG. 1 is a diagram to show the schematic configuration of a digital camera as an example of an image pickup apparatus to describe a first embodiment of the invention.

An image pickup system of the digital camera shown in the figure includes a mechanical shutter MS, a taking lens 1, an image pickup device 5, and a diaphragm 2, an infrared cut filter 3, and an optical low-pass filter 4 provided between the taking lens 1 and the image pickup device 5.

A system control section 11 for controlling the whole of an electric control system of the digital camera controls a flash light emission section 12 and a light reception section 13, controls a lens drive section 8 to adjust the position of the taking lens 1 to a focus position and make zoom adjustment, controls the aperture amount of the diaphragm 2 through a diaphragm drive section 9 to make light exposure adjustment, and performs opening/closing control of the mechanical shutter MS through a shutter drive section MSD. The shutter opening/closing control of the shutter drive section MSD is performed, whereby the exposure time period and non-exposure time period of the image pickup device 5 are controlled.

The system control section 11 also drives the image pickup device 5 through an image pickup device drive section 10 and outputs a subject image picked up through the taking lens 1 as a color signal. A command signal from the user is input to the system control section 11 through an operation section 14.

The electric control system of the digital camera further includes an analog signal processing section 6 connected to output of the image pickup device 5 for performing analog signal processing of correlated double sampling processing, etc., and an A/D conversion circuit 7 for converting color signals of RGB output from the analog signal processing section 6 into a digital signal. The analog signal processing section 6 and the A/D conversion circuit 7 are controlled by the system control section 11.

The electric control system of the digital camera further includes main memory 16, a memory control section 15 connected to the main memory 16, a digital signal processing section 17 for performing interpolation computation, gamma correction computation, RGB/YC conversion processing, etc., to generate image data, a compression and decompression processing section 18 for compressing the image data generated by the digital signal processing section 17 to a JPEG format and decompressing compressed image data, an integration section 19 for integrating photometric data to find a gain of white balance correction made by the digital signal processing section 17, an external memory control section 20 to which a detachable record medium 21 is connected, and a display control section 22 to which a liquid crystal display section 23 installed in the camera rear, etc., is connected. These sections are connected to each other by a control bus 24 and a data bus 25 and are controlled according to a command from the system control section 11.

Figure 2:
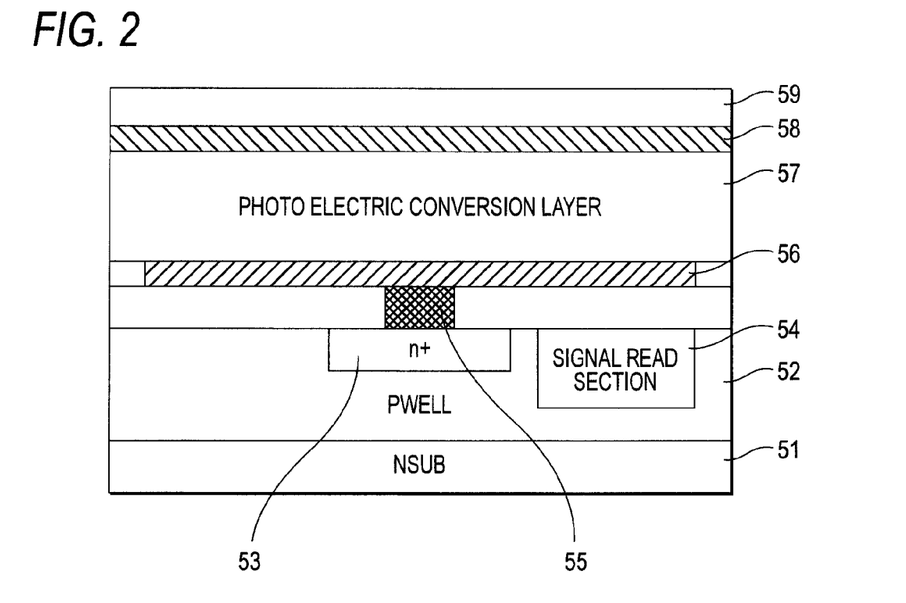
FIG. 2 is a sectional schematic drawing of one pixel part of an image pickup device of the first embodiment of the invention.

FIG. 2 is a sectional schematic drawing of one pixel part of the image pickup device 5 in FIG. 1. The image pickup device 5 has a configuration wherein a large number of pixels shown in FIG. 2 are arranged two-dimensionally or three-dimensionally.

The image pickup device 5 has a configuration wherein a photoelectric conversion element including a lower electrode 56, a photoelectric conversion layer 57 formed on the lower electrode 56, and an upper electrode 58 formed on the photoelectric conversion layer 57 is stacked above a semiconductor substrate made up of an n-type substrate 51 and a p well layer 52 formed thereon with the lower electrode 56 directed toward the semiconductor substrate side.

The lower electrode 56 is a highly transparent electrode divided for each pixel; for example, ITO is used.

The photoelectric conversion layer 57 is a layer made common to all pixels for absorbing light of a specific wave range and generating a signal charge (electron, hole) responsive to the light. The photoelectric conversion layer 57 contains either of an organic photoelectric conversion material or an inorganic photoelectric conversion material. In the description of the embodiment, it is assumed that the photoelectric conversion layer 57 absorbs light of a wave range of green, for example. Quinacridone can be named as such an organic photoelectric conversion material. The photoelectric conversion layer 57 may be divided for each pixel.

The upper electrode 58 is a highly transparent electrode made common to all pixels; for example, ITO is used. Wiring (not shown) is connected to the upper electrode 58 for applying a specific bias voltage to the upper electrode 58. A transparent protective film 59 is formed on the upper electrode 58. The upper electrode 58 may be divided for each pixel.

The polarity of the bias voltage applied to the upper electrode 58 is determined so that an electron of the charges generated in the photoelectric conversion layer 57 moves to the lower electrode 56 and a hole moves to the upper electrode 58.

An n-type impurity layer (n+ layer) 53 of a high concentration to store the electrons generated in the photoelectric conversion layer 57 and moved to the lower electrode 56 is formed in the p well layer 52. A veer plug 55 made of a conductive material of aluminum, etc., is formed on the n+ layer 53, and the lower electrode 56 is formed on the veer plug 55. The lower electrode 56 and the n+ layer 53 are electrically connected by the veer plug 55.

A signal read section 54 for converting the electron stored in the n+ layer 53 into a signal voltage and outputting the signal voltage to the outside of the image pickup device 5 is formed in and on the surface of the p well layer 52. The signal read section 54 is made up of a source follower circuit for converting the electron stored in the n+ layer 53 into a signal voltage and a reset transistor for resetting the electron stored in the n+ layer 53.

Figure 3:
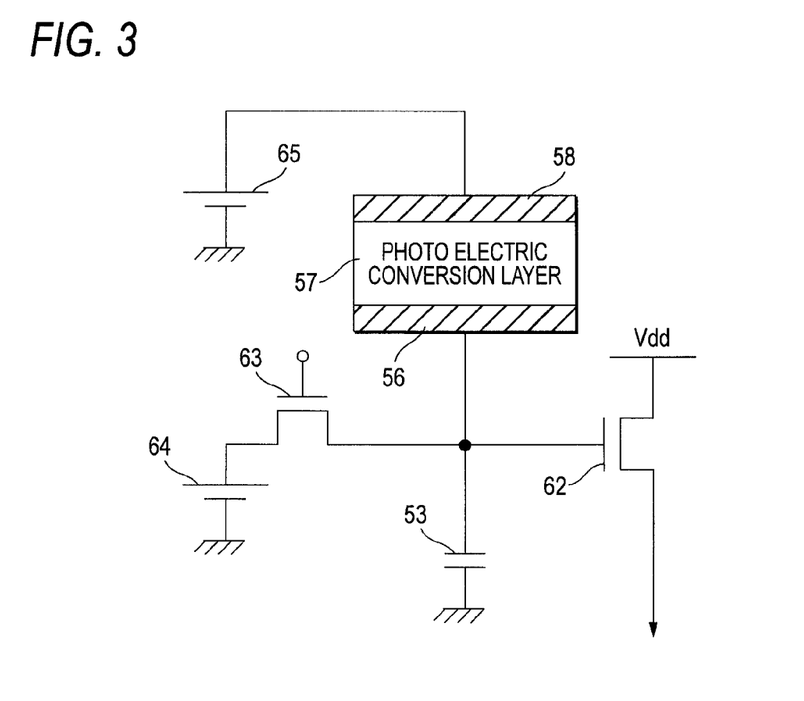
FIG. 3 is an equivalent circuit diagram of the image pickup device of the first embodiment of the invention.

FIG. 3 is an equivalent circuit diagram of the image pickup device 5 shown in FIG. 2. Components identical with or corresponding to those in FIG. 2 are denoted by the same reference numerals in FIG. 3.

As shown in FIG. 3, a bias power supply 65 for supplying a bias voltage is connected to the upper electrode 58 and a capacitor 53 corresponding to the n+ layer 53 is connected to the lower electrode 56. A first-stage transistor 62 of the source follower circuit is connected to the capacitor 53 and a reset drain power supply 64 is also connected to the capacitor 53 through a reset transistor 63. The electron stored in the capacitor 53 is converted into a signal voltage responsive to the amount of the electron through the first-stage transistor 62 of the source follower circuit and the signal voltage is amplified and then is output to the outside of the image pickup device 5.

The reset transistor 63 functions as a charge sweeping away section for sweeping away the electron stored in the capacitor 53 to the semiconductor substrate; when a reset voltage is supplied to a gate electrode from the image pickup device drive section 10 in FIG. 1, the reset transistor 63 is turned on and sweeps away the electron stored in the capacitor 53 to the reset drain power supply 64.

The image pickup device drive section 10 functions as a electrode potential fixing section and performs control to keep the potential of the lower electrode 56 connected to the capacitor 53 constant for a continuous given time period in the time period from the end of an exposure time period to the start of a subsequent exposure time period. Specifically, a reset voltage is applied to the gate electrode of the reset transistor 63 for the given time period, thereby keeping the potential of the lower electrode 56 constant.

The term "given time" mentioned here refers to a time longer than the minimum necessary time (minimum reset time period) for the reset transistor 63 to sweep away the maximum amount of the electron in a state in which the maximum amount of the electron that can be stored in the capacitor 53 is stored in the capacitor 53 and a time taken until the residual image component (residual image charge) existing in the photoelectric conversion layer 57 at the end point of the exposure time period is sufficiently discharged to the outside of the photoelectric conversion layer 57 in a state in which the same bias voltage as that at the start point of the exposure time period is applied to the photoelectric conversion layer 57.

As described above, it is known that the residual image charge in the photoelectric conversion layer 57 decreases exponentially with the passage of time. Thus, in the embodiment, the discharge amount of the residual image charge existing in the photoelectric conversion layer 57 at the end point of the exposure time period to the outside of the photoelectric conversion layer 57 in a state in which the same bias voltage as that at the start point of the exposure time period is applied to the photoelectric conversion layer 57 is measured, the time at which the discharge residual image charge amount decreases exponentially and becomes about 37% of the peak (the time is defined as attenuation time constant of residual image charge in the photoelectric conversion layer 57) is found, and the "time taken until the residual image charge is sufficiently discharged to the outside of the photoelectric conversion layer 57" may be set to the attenuation time constant or more. Ideally, it is the time taken until the amount of the residual image charge discharged from the photoelectric conversion layer 57 becomes zero from the exposure time end in a state in which the same bias voltage as that at the start point of the exposure time period is applied to the photoelectric conversion layer 57.

In the embodiment, the image pickup device drive section 10 supplies a reset voltage to the gate electrode of the reset transistor 63 for the given time period from the end point of the exposure time period, thereby making it possible to suppress image quality degradation and sensitivity lowering caused by the residual image charge stored in the charge storage section 53 in any other time period than the exposure time period without decreasing the exposure time period.

Next, the image pickup operation of the digital camera of the embodiment will be discussed.

Figure 4:
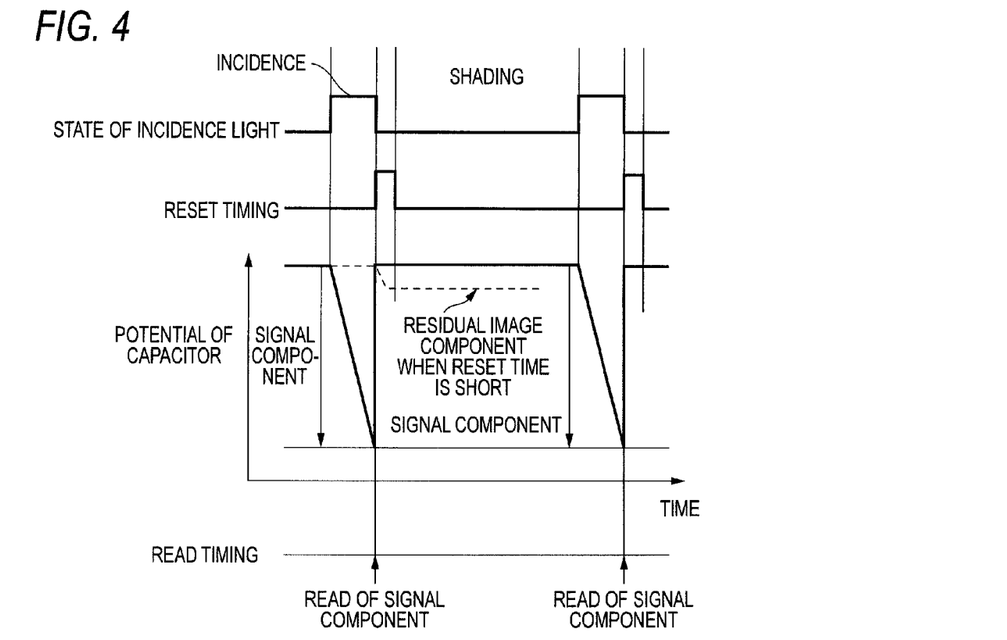
FIG. 4 is a timing chart to describe the reset operation of the image pickup device of the first embodiment of the invention.

FIG. 4 is a timing chart to describe the reset operation of the image pickup device 5.

When the electron generated in the photoelectric conversion layer 57 in response to light incident in the exposure time period during which the mechanical shutter MS is open is stored in the capacitor 53, the potential of the capacitor 53 rises as shown in the figure. When the mechanical shutter MS is closed and the exposure time period terminates, the source follower circuit outputs a signal responsive to the electron stored in the capacitor 53 and supplying a reset voltage to the reset transistor 63 is started and is continued for the given time period mentioned above. The electron in the capacitor 53 is swept away to the reset drain power supply 64 with the supply start of the reset voltage and the residual image charge moved to the lower electrode 56 after the termination of the exposure time period is also swept away to the reset drain power supply 64. While the reset voltage is supplied, the potential of the capacitor 53 is maintained in the state just after reset. After the expiration of the given time period, the supply of the reset voltage is stopped, but the residual image charge scarcely moves to the capacitor 53 at this point in time and thus the potential of the capacitor 53 scarcely fluctuates. From the state, the next exposure time period is started.

According to the digital camera of the embodiment, the reset operation is continuously performed for the given time period from just after the termination of the exposure time period, so that the potential of the capacitor 53 in the time period (corresponding to the potential of the lower electrode 56) can be fixed to the potential of the reset drain power supply 64. Since the potential of the capacitor 53 is fixed in the time period, the bias voltage applied to the photoelectric conversion layer 57 becomes higher than that in the drive example shown in FIG. 7 and the transport performance of the residual image charge generated in the photoelectric conversion layer 57 improves. Thus, the time until the residual image charge is discharged to the outside of the photoelectric conversion layer 57 can be made shorter than that in the drive example shown in FIG. 7. In the embodiment, the reset operation may be performed for the given time period equal to the attenuation time constant of the residual image charge in the photoelectric conversion layer 57 in a state in which the optimum bias voltage is applied to the photoelectric conversion layer 57, and consequently the reset operation time can be made shorter than that in FIG. 7. Since the reset operation time can be shortened, the start timing of the next exposure time can be hastened and the exposure time can be prolonged.

Thus, according to the digital camera of the embodiment, image quality degradation caused by the residual image charge can be prevented and lowering of the carrier transport efficiency of the photoelectric conversion layer 57 caused by starting of exposure with the residual image charge stored in the capacitor 53 can also be prevented for improving the sensitivity.

In the description given above, the image pickup device drive section 10 supplies a reset voltage to the gate electrode of the reset transistor 63 for the given time period from the end point of the exposure time period, thereby keeping the potential of the lower electrode 56 constant, but the applying timing of the reset voltage is not limited to it. For example, applying the reset voltage may be continued from the end point of the exposure time period to the start point of the next exposure.

In the description given above, the exposure time period is controlled with the mechanical shutter MS, but the invention can also be applied to a digital camera installing no mechanical shutter MS. If no mechanical shutter MS is installed in the digital camera in FIG. 1, light is also incident on the image pickup device 5 in the time period of the shading state shown in FIG. 4. Thus, in this case, the electron stored in the capacitor 53 needs to be reset at least just before the start of the exposure time period.

If a reset voltage is applied only for the minimum reset time period just before the start of an exposure time period (first case), the carrier transport efficiency lowers due to the electron stored in the capacity 53 before the reset voltage is applied and thus the residual image charges exist much in the photoelectric conversion layer 57 at the start point of the exposure time period.

On the other hand, if a reset voltage is applied for a time period longer than the minimum reset time period (for example, throughout the time period between one exposure time period and a subsequent exposure time period) just before the start of an exposure time period, the amount of the residual image charges in the photoelectric conversion layer 57 decreases at the start point of the exposure time period as compared with the first case, so that the image quality can be improved more than that in the first case. Thus, to control the exposure time period using the reset voltage as an electronic shutter pulse without using a mechanical shutter, the image quality can also be improved by applying the reset voltage for a longer time period than the minimum reset time period.

Second Embodiment

Figure 5:
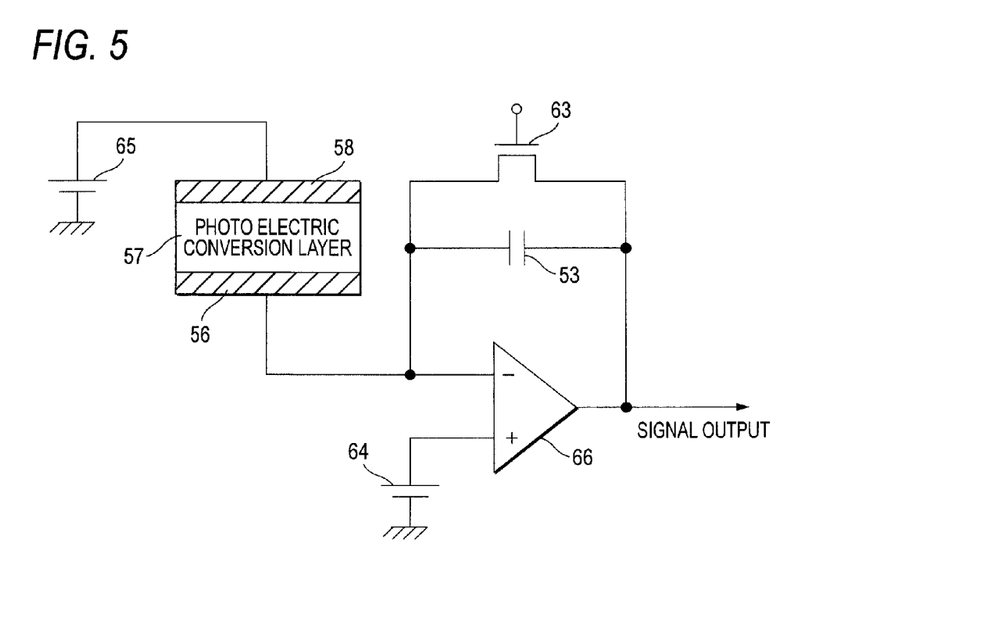
FIG. 5 is an equivalent circuit diagram of an image pickup device of a second embodiment of the invention.

In the first embodiment, keeping the potential of the lower electrode 56 constant is accomplished by controlling the applying time of the reset voltage; in a second embodiment of the invention, it is accomplished by devising the circuit configuration of signal read section 54. The general configuration of a digital camera described in the second embodiment and the configuration of an image pickup device installed in the digital camera are similar to those in FIGS. 1 and 2. The second embodiment differs from the first embodiment only in the configuration of the signal read section 54 shown in FIG. 2 and the function of image pickup device drive section 10. The configuration of the signal read section 54 in the second embodiment will be discussed below:

FIG. 5 is an equivalent circuit diagram of an image pickup device installed in a digital camera of the second embodiment of the invention. Components identical with or corresponding to those in FIG. 2 are denoted by the same reference numerals in FIG. 5.

A signal read section 54 of an image pickup device shown in FIG. 5 includes a reset transistor 63, a reset drain power supply 64, and an inverting amplifier 66 functioning as an electrode potential fixing section. A bias power supply 65 for supplying a bias voltage is connected to an upper electrode 58 and a lower electrode 56 is connected to an inverting input terminal of the inverting amplifier 66. A non-inverting input terminal of the inverting amplifier 66 is connected to the reset drain power supply 64. A capacitor 53 corresponding to an n+ layer 53 is connected between the inverting input terminal and an output terminal of the inverting amplifier 66, and the reset transistor 63 is connected to both ends of the capacitor 53.

The reset transistor 63 functions as a charge sweeping away section for sweeping away the electron stored in the capacitor 53 to a semiconductor substrate; when a reset voltage is supplied to a gate electrode from the image pickup device drive section 10 in FIG. 1, the reset transistor 63 is turned on and sweeps away the electron stored in the capacitor 53. In the embodiment, it is assumed that the image pickup device drive section 10 applies a reset voltage only for the minimum reset time period just before the start of an exposure time period, thereby resetting the stored charge and the residual image charge.

The operation of the described signal read section 54 is as follows:

When an electron generated in a photoelectric conversion layer 57 is stored in the capacitor 53, the stored electron causes a potential difference to occur across the capacitor 53 depending on the electron amount and the capacitor capacitance. Since the capacitor 53 exists between the inverting input terminal and the output terminal of the inverting amplifier 66, a signal voltage responsive to the potential difference is inverted and amplified in the inverting amplifier 66 and is output to the outside of the image pickup device 5. After the signal is output, just before the start of an exposure time period, the reset transistor 63 is turned on, the electron stored in the capacitor 53 is reset, and the output terminal of the inverting amplifier 66 settles into the potential of the reset drain power supply 64. Since the lower electrode 56 is connected to the inverting input terminal of the inverting amplifier 66, the potential of the lower electrode 56 is always fixed to the potential of the reset drain power supply 64 during the operation time period of the image pickup device 5.

The signal read section 54 is set to the circuit configuration as shown in FIG. 5, whereby the potential of the lower electrode 56 can always be kept in the fixed potential supplied from the reset drain power supply 64. Thus, image quality degradation and sensitivity lowering caused by the residual image charge can be prevented without devising control of the reset voltage. The time period during which the reset operation is to be performed needs only to be the minimum reset time period, so that it is also made possible to extend the exposure time. Since an optimum bias voltage is always applied to the photoelectric conversion layer 57, the carrier transport efficiency can always be maximized and further sensitivity improvement can be accomplished.

Third Embodiment

Figure 6:
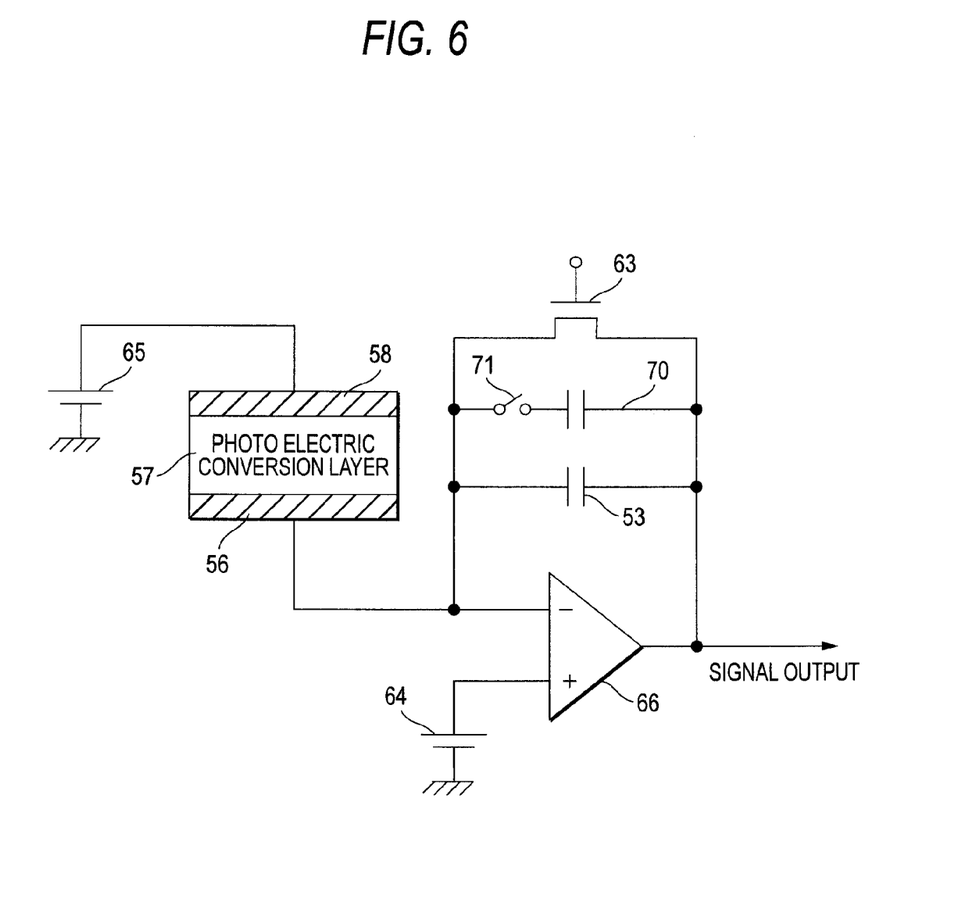
FIG. 6 is an equivalent circuit diagram of an image pickup device installed in a digital camera of a third embodiment of the invention.

FIG. 6 is an equivalent circuit diagram of an image pickup device installed in a digital camera of a third embodiment of the invention. Components identical with or corresponding to those in FIG. 5 are denoted by the same reference numerals in FIG. 6.

The image pickup device shown in FIG. 6 has a configuration wherein a series circuit made up of a capacitor 70 and a switch 71 in parallel to a capacitor 53 is provided between the inverting input terminal and the output terminal of the inverting amplifier 66 of the image pickup device shown in FIG. 5. The switch 71 is connected at one end to the inverting input terminal of the inverting amplifier 66 and at an opposite end to one end of the capacitor 70. The output terminal of the inverting amplifier 66 is connected to an opposite end of the capacitor 70.

A system control section 11 of the digital camera determines whether or not the electrode stored in the capacity 53 exceeds the capacitance of the capacity 53 by pre-photographing (photographing to execute an autofocus function and determine an exposure condition) performed before principal photographing (photographing to take a photograph of a subject and record photograph image data on a record medium 21). Only if the electrode stored in the capacity 53 exceeds the capacitance of the capacity 53, the switch 71 is turned on through an image pickup device drive section 10 for connecting the inverting input terminal of the inverting amplifier 66 and the capacitor 70 under the control of the system control section 11.

Figure 7:
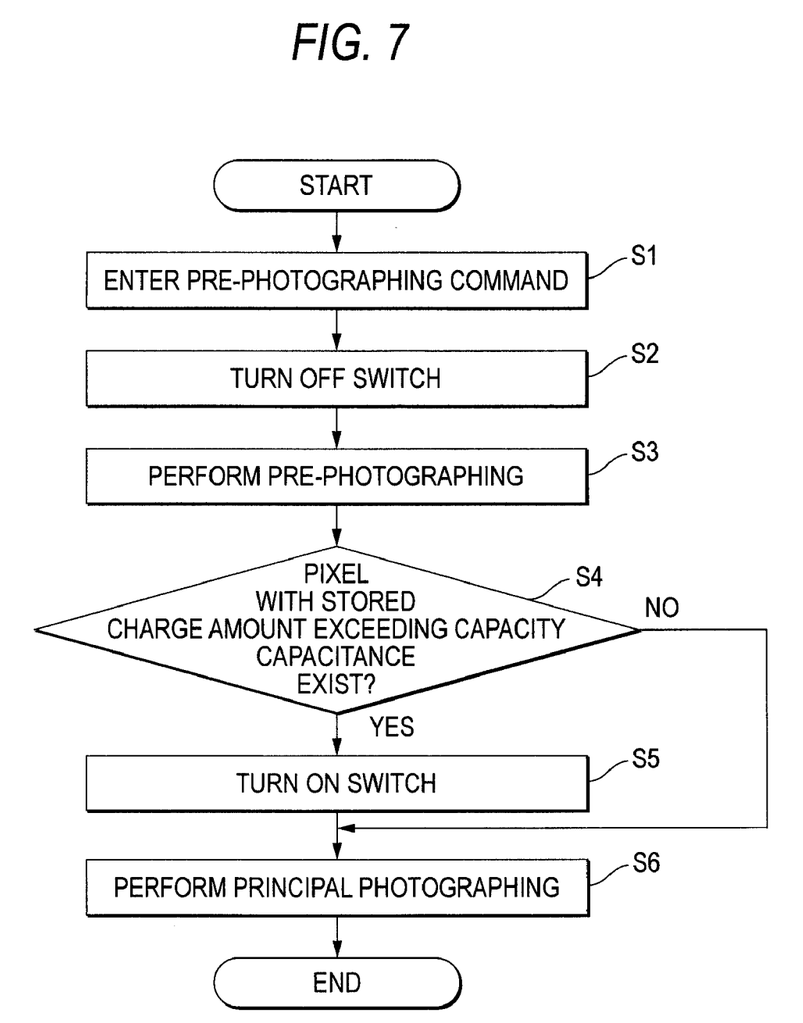
FIG. 7 is a flowchart to describe an operation flow of the digital camera of the third embodiment of the invention.

The operation of the digital camera installing the image pickup device shown in FIG. 6 is as follows: FIG. 7 is a flowchart to describe an operation flow of the digital camera of the third embodiment of the invention.

When a photographing mode is set and a pre-photographing command is entered by the user (step S1), the system control section 11 turns off the switch 71 through the image pickup device drive section 10 (step S2) and performs control to execute pre-photographing in response to the command (step S3). When pre-photographing is performed, an electron generated in a photoelectric conversion layer 57 is stored in the capacitor 53. The system control section 11 determines whether or not a pixel with the charge stored in the capacitor 53 exceeding the capacitance of the capacity 53 as pre-photographing is performed exists in all pixels of the image pickup device 5 is (step S4). Only if a pixel with the stored charge amount exceeding the capacitance of the capacity 53 exists (YES at step S4), the switch 71 is turned on under the control of the system control section 11 (step S5).

For example, if the signal level output from the inverting amplifier 66 reaches the signal level output when as much charge as the capacitance of the capacity 53 is stored in the capacity 53, the system control section 11 determines that a pixel with the charge stored in the capacitor 53 exceeding the capacitance of the capacity 53 exists.

Then, when a principal photographing command is entered by the user, principal photographing is performed in response to the command (step S6), an electron generated in the photoelectric conversion layer 57 is stored in the capacitors 53 and 70, a signal responsive to the stored charge is output from the output terminal of the inverting amplifier 66, and photograph image data obtained from the output signal is recorded on a record medium 21. After the principal photographing terminates, the charge stored in the capacitor 53 and the charge stored in the capacitor 70 are reset at the same time by turning on the reset transistor 63 with the switch 71 turned on.

The digital camera performs such operation whenever a pre-photographing command is entered.

When the switch 71 is on, the charge generated in the photoelectric conversion layer 57 is stored in the two capacitors 53 and 70 and the capacitance of charge that can be stored grows to the total of the capacitance of the capacitor 53 and the capacitance of the capacitor 70. Thus, photographing in an expanded dynamic range is made possible.

Thus, according to the digital camera of the embodiment, whether wide dynamic range photographing with the switch 71 turned on is to be performed or usual dynamic range photographing with the switch 71 turned off is to be performed is determined as pre-photographing is performed, and either can be selected for execution, so that it is made possible to take a photograph in the optimum photographing mode in response to a subject.

In the first and second embodiments, the lower electrode 56 is electrically connected to the charge storage section 53, but the upper electrode 58 may be electrically connected to the charge storage section 53. In this case, the bias voltage may be applied to the lower electrode 56 so that a hole moves to the lower electrode 56 and an electron moves to the upper electrode 58.

In the first and second embodiments, an electron is used as a carrier for generating a signal output to the outside of the image pickup device 5, but a hole may be used as the carrier. In this case, the bias voltage may be applied to the upper electrode 58 so that a hole moves to the lower electrode 56 and an electron moves to the upper electrode 58.

In the first and second embodiments, the structure wherein one photoelectric conversion layer 57 is stacked above the semiconductor substrate as one pixel of the image pickup device 5 is taken as an example. The invention is effective for a structure wherein at least one photoelectric conversion layer is stacked above a semiconductor substrate and the photoelectric conversion layer and a charge storage section are electrically connected, and is not limited to the configuration shown in FIG. 2.

According to the invention, there can be provided an image pickup apparatus capable of preventing image quality degradation and sensitivity lowering caused by a charge stored in a charge storage section in any other time period than an exposure time period and extending the exposure time period.

The entire disclosure of each and every foreign patent application from which the benefit of foreign priority has been claimed in the present application is incorporated herein by reference, as if fully set forth.

What is claimed is:

1. An image pickup apparatus comprising an image pickup device,
the image pickup device comprising: a semiconductor substrate; a photoelectric conversion element stacked above the semiconductor substrate; and a charge storage section in the semiconductor substrate, the charge storage section storing a charge generated in the photoelectric conversion element, to outputs a signal responsive to the charge stored in the charge storage section to an outside of the image pickup device,
wherein the photoelectric conversion element comprises: a lower electrode above the semiconductor substrate; a photoelectric conversion layer on the lower electrode; and an upper electrode on the photoelectric conversion layer,
wherein the charge storage section is electrically connected to the lower electrode or the upper electrode,
wherein the image pickup apparatus further comprises:
a charge sweeping away section that sweeps away the charge stored in the charge storage section; and
an electrode potential fixing section that keeps a potential of the lower electrode or the upper electrode constant at least for a continuous given time period in a time period from end of an exposure time period of the image pickup device to start of a subsequent exposure time period,
wherein the given time period is a time longer than a minimum necessary time for the charge sweeping away section to sweep away a maximum amount of the charge in a state in which the maximum amount of the charge that can be stored in the charge storage section is stored in the charge storage section.

2. The image pickup apparatus as claimed in claim 1, further comprising a shading section that shades the image pickup device between the exposure time period and the subsequent exposure time period,
wherein the given time period is started at the end point of the exposure time period and is equal to an attenuation time constant of residual image charge in the photoelectric conversion layer when the residual image charge existing in the photoelectric conversion layer at the end point of the exposure time period is discharged to an outside of the photoelectric conversion layer in a state in which the same bias voltage as that at the start point of the exposure time period is applied to the photoelectric conversion layer.

3. The image pickup apparatus as claimed in claim 1,
wherein the charge sweeping away section is a reset transistor, and
wherein the electrode potential fixing section keeps the potential constant by applying a reset voltage to a gate electrode of the reset transistor for the given time period.

4. The image pickup apparatus as claimed in claim 1,
wherein when the image pickup device is represented as an equivalent circuit, the electrode potential fixing section is a differential amplifier, the differential amplifier comprising an inverting input terminal connected to the lower electrode or the upper electrode and a non-inverting input terminal connected to fixed potential with a first capacitor corresponding to the charge storage section connected between the inverting input terminal and an output terminal, and always keeps the potential in the fixed potential during an operation time period of the image pickup device.

5. The image pickup apparatus as claimed in claim 4, further comprising a series circuit connected in parallel to the first capacitor between the inverting input terminal and the output terminal,
wherein the series circuit comprises a switch connected to the inverting input terminal and a second capacitor connected to the switch, the second capacitor being different from the first capacitor.

6. The image pickup apparatus as claimed in claim 5, further comprising a switch control section that performs control so as to turn on the switch for connecting the inverting input terminal and the second capacitor only if charge stored in the first capacitor exceeds a capacitance of the first capacitor as pre-photographing is performed before principal photographing is performed.

* * * * *